(12) United States Patent
White

(10) Patent No.: US 6,564,636 B2
(45) Date of Patent: May 20, 2003

(54) WIDE BAND DIGITAL PHASE LOCKED LOOP (PLL) WITH A HALF-FREQUENCY OUTPUT

(75) Inventor: Stanley A. White, San Clemente, CA (US)

(73) Assignee: Honeywell International Inc., Morristown, NJ (US)

( * ) Notice: Subject to any disclaimer, the term of this patent is extended or adjusted under 35 U.S.C. 154(b) by 94 days.

(21) Appl. No.: 09/935,278

(22) Filed: Aug. 22, 2001

(65) Prior Publication Data

US 2003/0041667 A1 Mar. 6, 2003

(51) Int. Cl.[7] .............................................. G01C 19/00
(52) U.S. Cl. ................................................. 73/504.02
(58) Field of Search ....................... 73/504.02, 504.03, 73/504.04, 504.12; 702/106, 147, 142

(56) References Cited

U.S. PATENT DOCUMENTS

| RE32,931 E | | 5/1989 | Staudte | |
|---|---|---|---|---|
| 5,056,366 A | | 10/1991 | Fersht et al. | |
| 5,379,223 A | * | 1/1995 | Asplund | 364/434 |
| 5,383,362 A | * | 1/1995 | Putty et al. | 73/505 |
| 5,459,432 A | * | 10/1995 | White et al. | 329/307 |
| 5,675,498 A | | 10/1997 | White | |
| 6,311,555 B1 | * | 11/2001 | McCall et al. | 73/488 |

* cited by examiner

Primary Examiner—Richard A. Moller

(57) ABSTRACT

A digital phase locked loop includes an automatic gain control that applies a gain to an input signal in order to provide a gain controlled signal. A 90° phase shifter applies a 90° phase shift to the gain controlled signal in order to provide a 90° phase shifted version of the gain controlled signal. A phase detector is driven by the gain controlled signal, by the 90° phase shifted version of the gain controlled signal, and by sinusoidal and co-sinusoidal signals. A loop filter integrates an output of the phase detector and provide servo equalization for the phase-locked loop. A digital dual frequency oscillator has a fundamental frequency controlled by an output signal from the loop filter. Also, the digital dual frequency oscillator generates the sinusoidal and co-sinusoidal signals.

39 Claims, 4 Drawing Sheets

WIDE BAND DIGITAL PHASE LOCKED LOOP (PLL) WITH A HALF-FREQUENCY OUTPUT

TECHNICAL FIELD OF THE INVENTION

The present invention relates to a phase locked loop that produces an output signal whose frequency is half of the frequency of the input signal to the phase locked loop.

BACKGROUND OF THE INVENTION

A phase locked loop is typically implemented as an electronic circuit that controls an oscillator so that the oscillator maintains a constant phase angle relative to a reference signal. Such a phase locked loop may be used for coherent carrier tracking and threshold extension, bit synchronization, symbol synchronization, tape synchronization, modems, FSK demodulation, FM demodulation, frequency synthesizer, tone decoding, frequency multiplication and division, SCA demodulators, telemetry receivers, signal regeneration, and coherent demodulators. Such a phase locked loop can also be used in connection with angular rate sensors.

Angular rate sensors are used as components of navigational and inertial guidance systems for aircraft, spacecraft, ships, missiles, etc. Although mechanical gyroscopes were used in the past for angular rate sensing, ring laser gyros and vibrating quartz gyros have displaced mechanical gyros because ring laser gyros and vibrating quartz gyros have characteristics that are superior to those of mechanical gyros.

A particularly economical vibrating quartz gyro employs pairs of parallel tines. Such a quartz gyro is described, for example, in Fersht et al., U.S. Pat. No. 5,056,366 and in Staudte, U.S. Pat. No. Re 32,931. One pair of tines (the drive tines) is driven by an oscillator so that the tines move toward each other and away from each other. Rotational motion of the tines about a central longitudinal axis causes the vibration of the drive tines to couple, by coriolis force, to the other pair of tines (the pick-off tines). The coriolis force causes the pick-up tines to vibrate in such a way that, when one pick-off tine moves in one direction, another pick-off tine moves in the opposite direction. The force, which drives the pick-off tines, is proportional to the cross-product of the angular rate of rotation and the linear velocity of the drive tines.

The output signal from the quartz gyro appears as a double-sideband suppressed-carrier (DSSC) modulation of the input angular rate, where the carrier frequency is the frequency of oscillation of the drive tines. Therefore, an angular rate signal can be recovered from the output signal by a synchronous demodulator.

Analog circuits have been used for driving the quartz gyro and for synchronous demodulation of the output signal. Analog circuits, however, are subject to voltage offsets and component value drift due to temperature variations and aging. These problems are particularly troublesome due to peculiarities of the quartz gyro that are not apparent from the simplified or "first order" operating characteristics of the analog circuit.

One such problem is related to the resonant frequencies of the drive tines and the pick-off tines. If the pick-off tines have the same resonant frequency as the drive tines, a maximum amplitude response is obtained from the pick-off tines. Thus, the signal to noise ratio is optimum. On the other hand, it is undesirable for the pick-off tines to have exactly the same resonant frequency as the drive tines because of the resulting non-linearity between the output angular rate signal and input angular rate that occurs due to the impact of pick-off tines dynamics on the output signal.

Accordingly, a compromise is usually achieved between the need for a more linear function and the need to avoid limiting the dynamic range due to noise. This compromise is achieved by providing a resonant frequency offset that is, to an extent, dependent on the bandwidth of the angular rate signal. In particular, the pick-off tines have a two-pole resonance characteristic, giving a second-order response far away from the resonant frequency.

In practice, these considerations dictate that the difference between the resonant frequency of the drive tines and the resonant frequency of the pick-off tines should be about twice the bandwidth of the angular rate to be sensed by the quartz gyro. A typical quartz gyro for inertial navigation applications, for example, has a difference of about 100 Hz between the drive resonant frequency and the pick-off resonant frequency. This difference in resonant frequencies causes the amplitude of the angular rate signal to be dependent on the frequency, as well as on the amplitude of vibration, of the drive tines. Moreover, the temperature dependence of the difference between the drive and pick-off resonant frequencies is the most critical temperature dependent parameter of the quartz gyro.

To obtain sufficient performance for inertial navigation, the analog circuits associated with the quartz gyro have been relatively complex and expensive. Moreover, it is estimated that the limitations of the prior art analog circuitry cause the performance of the quartz gyro to be about an order of magnitude less than that theoretically possible and attainable by sufficiently complex digital signal processing.

The present invention is directed to a phase locked loop that overcomes one or more of the problems of the prior art.

SUMMARY OF THE INVENTION

In accordance with one aspect of the present invention, an apparatus that implements a digital phase locked loop comprises an automatic gain control, a 90° phase shifter, a phase detector, a loop filter, and a digital dual frequency oscillator. The automatic gain control applies gain to an input signal in order to produce a gain controlled signal. The 90° phase shifter provides a 90° phase shifted version of the gain controlled signal. The phase detector is driven by the gain controlled signal, by the 90° phase shifted version of the gain controlled signal, and by sinusoidal and co-sinusoidal signals. The loop filter integrates an output of the phase detector and provides servo equalization for the phase-locked loop. The digital dual frequency oscillator has a fundamental frequency controlled by an output signal from the loop filter in order to generate the sinusoidal and co-sinusoidal signals.

In accordance with another aspect of the present invention, a method implemented by a phase locked loop comprises the following: applying a gain to an input signal to produce an in-phase gain controlled signal, wherein the input signal has a frequency $2f_0$; shifting the in-phase gain controlled signal by 90° to produce a quadrature gain controlled signal; detecting a phase difference dependent upon the in-phase gain controlled signal, the quadrature gain controlled signal, and first and second output signals; and, producing the first and second output signals and a third output signal in response to the phase difference, wherein the third output signal has a frequency $f_0$, and wherein the each of the first and second output frequencies has a frequency $2f_0$.

In accordance with yet another aspect of the present invention, a method of driving a gyro comprises the following: shifting an in-phase signal by 90° to produce a quadrature signal, wherein the in-phase signal is derived from a first output of the gyro, wherein the in-phase signal has a frequency $2f_0$, and wherein the quadrature signal has a frequency $2f_0$; detecting a phase difference dependent upon the in-phase signal, the quadrature signal, and first and second output signals; producing the first and second output signals and a third output signal in response to the phase difference, wherein the third output signal has a frequency $f_0$, and wherein the each of the first and second frequencies has a frequency $2f_0$; producing an angular rate indicating signal based upon a second output of the gyro and the first and second output signals; and, driving the gyro in response to the third output signal.

BRIEF DESCRIPTION OF THE DRAWINGS

These and other features and advantages will become more apparent from a detailed consideration of the invention when taken in conjunction with the drawings in which.

DETAILED DESCRIPTION

Figure 1:
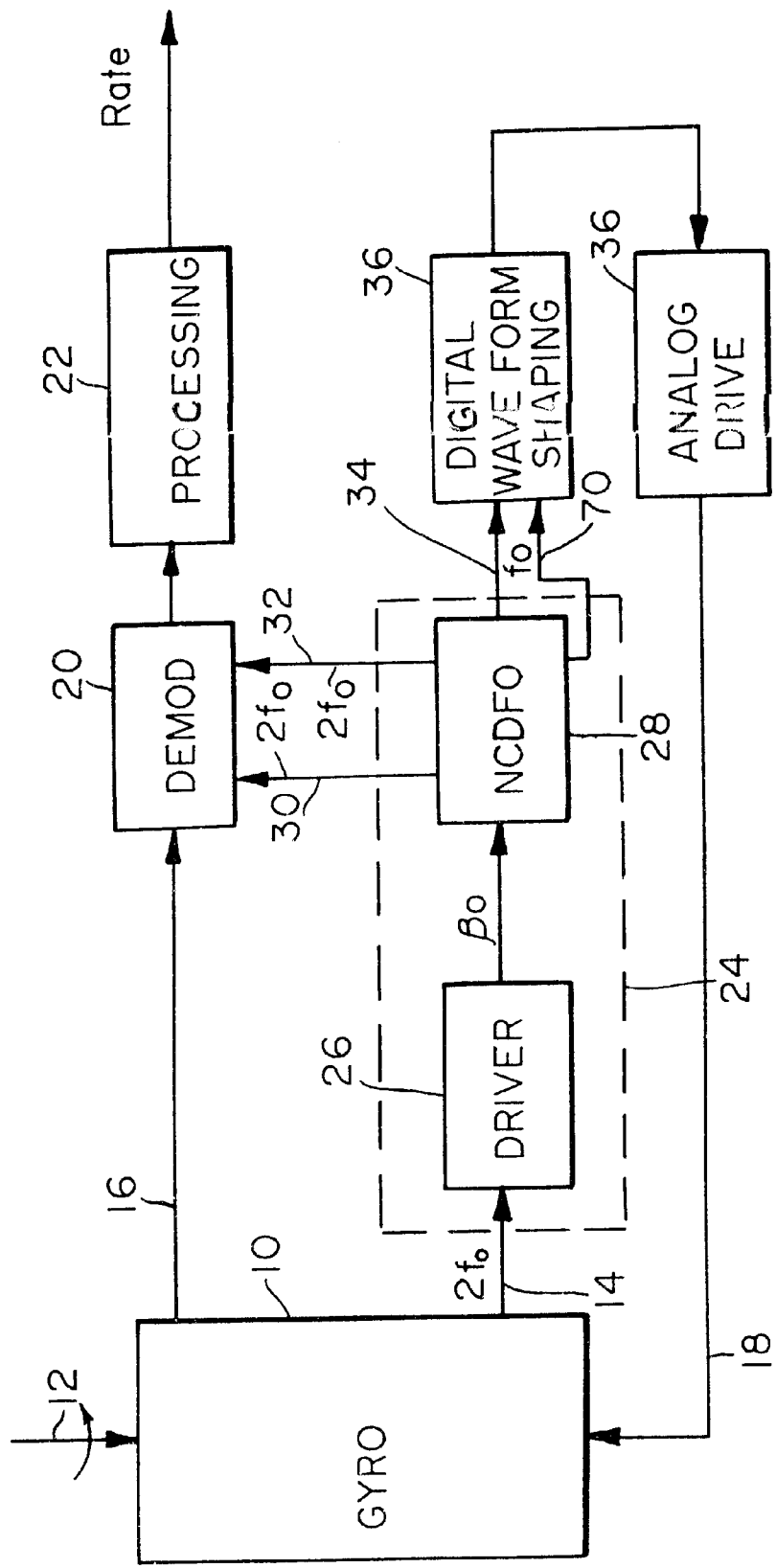
FIG. 1 shows a rate sensing system in accordance with the present invention.

As shown in FIG. 1, a gyro 10 is responsive to an angular rate input 12 to provide output signals 14 and 16. The output signal 14 is a sampled sinusoidal carrier signal having a frequency equal to $2f_0$, where $f_0$ is the frequency of an analog motor drive signal 18 applied to the gyro 10. The output signal 16 is a sampled double-sideband suppressed-carrier (DSSC) modulation of the angular rate input 12 containing the angular input rate information. The output signal 16 is demodulated by a demodulator 20 to recover the angular input rate information, and is further processed by a signal processor 22 for supply to a downstream load such as a flight control computer.

The output signal 14 is detected by a phase locked loop 24 comprised of a driver 26 and a numerically controlled digital dual frequency oscillator 28. The driver 26 receives the output signal 14 from the gyro 10 and provides a frequency controlling signal $\beta_0$ to the numerically controlled digital dual frequency oscillator 28. The numerically controlled digital dual frequency oscillator 28 responds to the frequency controlling signal $\beta_0$ by supplying demodulation reference signals 30 and 32 each at the frequency $2f_0$ to the demodulator 20 and by supplying a motor control signal 34 at the frequency $f_0$ to a motor control signal conditioner 36 which, in turn, provides the analog motor drive signal 18 to the gyro 10.

Figure 2:
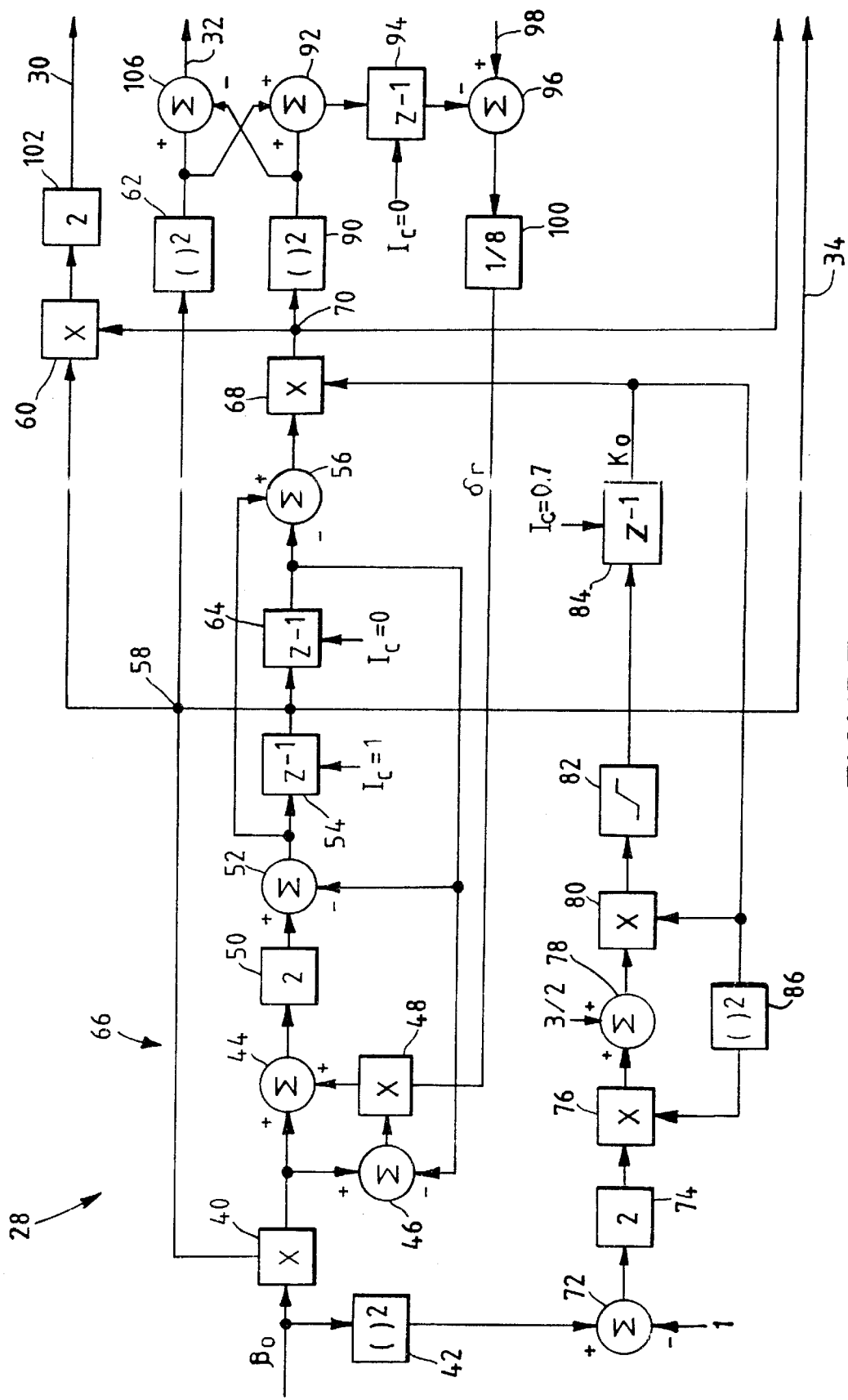
FIG. 2 shows in additional detail a numerically controlled digital dual frequency oscillator of the rate sensing circuit shown in FIG. 1.

The numerically controlled digital dual frequency oscillator 28 is shown in more detail in FIG. 2. The fundamental frequency of oscillation of the numerically controlled digital dual frequency oscillator 28 is given by the following equation:

$$f_0 = \frac{1}{2\pi T}\arccos(\beta_0) \quad (1)$$

where T is the sampling period. For example, if the sampling frequency used to generate the samples processed by the phase locked loop 24 is 39,600 Hz, the sampling period T is 1/39,600.

The frequency controlling signal $\beta_0$ is coupled to a first input of a first multiplier 40 and to a first squaring element 42 of the numerically controlled digital dual frequency oscillator 28. The first multiplier 40 has an output coupled to a first positive input of a first summer 44 and to a positive input of a second summer 46 whose output is coupled to a first input of a second multiplier 48. The output of the second multiplier 48 is coupled to a second positive input of the first summer 44. The first summer 44 has an output which is coupled to the input of a first doubler 50 whose output is coupled to a positive input of a third summer 52. The output of the third summer 52 is coupled to the input of a first single-sample-period-delay element 54 and to a positive input of a fourth summer 56. The first single-sample-period-delay element 54 has an initial condition input of 1.0 and an output coupled through a node 58 to a second input of the first multiplier 40, to a first input of a third multiplier 60, to the input of a second squaring element 62, and to the input of a second single-sample-period-delay element 64. The first single-sample-period-delay element 54 also provides the motor control signal 34. The second single-sample-period-delay element 64 has an initial-condition input of 0 and has an output coupled to a negative input of the fourth summer 56, to a negative input of the second summer 46, and to a negative input of the third summer 52.

Those familiar with the art will recognize that the first multiplier 40, the first doubler 50, the third summer 52, the first single-sample-period-delay element 54, and the second single-sample-period-delay element 64 form a fundamental oscillator 66. The primary output of the fundamental oscillator 66 is the signal at the node 58. The first summer 44, the second summer 46, and the second multiplier 48 provide an amplitude control for the oscillator 66 in response to a signal δr as discussed below.

The fourth summer 56 has an output which is coupled to a first input of a fourth multiplier 68 and which provides a signal that is 90° out of phase with the signal at the node 58. The fourth multiplier 68 applies an amplitude correction $K_0$ to the output of the fourth summer 56 where the amplitude correction $K_0$ is given by the following equation:

$$K_0 = \frac{1}{2\sin(2\pi f_0 T)} \quad (2)$$

such that the peak amplitude of the sinusoidal signal at a node 70 at the output of the fourth multiplier 68 has the peak same amplitude as the signal at the node 58. Accordingly, the signals at the nodes 58 and 70 form a sine/cosine pair. The output of the fourth multiplier 68 is provided to a second input of the third multiplier 60.

From equations (1) and (2), it can be seen that the square of $K_0$ is given by the following equation:

$$K_0^2 = \frac{1}{4(1-\beta_0^2)} \quad (3)$$

An error function for the amplitude correction $K_0$ may be defined in accordance with the following equation:

$$f(K_0) = K_0^{-2} + 4(\beta_0^2 - 1) \quad (4)$$

which can be used in an iterative Newton-Raphson procedure to solve for $K_0$.

Specifically, the amplitude correction $K_0$ is obtained from the frequency controlling signal $\beta_0$, which is given by the following equation:

$$\beta_0 = \cos(2\pi f_0 T) \quad (5)$$

where $f_{max} \geq f_0 \geq f_{min}$ is the frequency of oscillation, by first squaring $\beta_0$ through the use of the first squaring element 42. The output of the first squaring element 42 is provided to a positive input of a fifth summer 72 is whose negative input receives the value 1. The output of the fifth summer 72 is scaled by 2 in a second doubler 74 and the scaled output of the fifth summer 72 is applied to a first input of a fifth multiplier 76. The output of the fifth multiplier 76 is provided to a first positive input of a sixth summer 78 and a value of 3/2 is provided to a second positive input of the sixth summer 78. The output of the sixth summer 78 is coupled to a first input of a sixth multiplier 80. The output of the sixth multiplier 80 is coupled to the input of a limiter 82 which limits the amplitude of the signal from the sixth multiplier 80 between a maximum value $K_{max}$ according to the following equation:

$$K_{max} = \frac{1}{2\sin(2\pi f_{min} T)} \quad (6)$$

and a minimum value $K_{min}$ according to the following equation:

$$K_{min} = \frac{1}{2\sin(2\pi f_{max} T)} \quad (7)$$

where $f_{max}$ and $f_{min}$ are the known end frequencies of operation and where $f_{max} < 1/(4T)$.

The output of the limiter 82 is coupled to the input of a third single-sample-period-delay element 84 which has an initial condition input that is roughly the average of $K_{max}$ and $K_{min}$. The output of the third single-sample-period-delay element 84 is coupled to a second input of the fourth multiplier 68, to a second input of the sixth multiplier 80, and to the input of a third squaring element 86 whose output is coupled to a second input of the fifth multiplier 76. Accordingly, the first squaring element 42, the fifth summer 72, the second doubler 74, the fifth multiplier 76, the sixth summer 78, the sixth multiplier 80, the limiter 82, the third single-sample-period-delay element 84, and the third squaring element 86 mechanize an iterative Newton-Raphson procedure to solve for $K_0$.

The characteristic equation of a second-order digital system can be written as the following equation:

$$1 - 2r\beta z^{-1} + r^2 z^{-2} = 0 \quad (8)$$

If $r=1$, this second-order digital system has a stable oscillation defined by the frequency parameter $\beta$. However, if $r>1$, the amplitude of the oscillation grows, and if $r<1$, the amplitude of the oscillation decays.

The variable $r$ may be defined in accordance with the following equation:

$$r = 1 + \delta r \quad (9)$$

For small values of $\delta r$, the square of $r$ may be approximated by the first two terms of a power-series expansion as given by the following:

$$(1 + \delta r)^2 \approx 1 + 2\delta r \quad (10)$$

Substituting equations (9) and (10) into equation (8) produces the following equation:

$$1 - 2(1 + \delta r)\beta z^{-1} + (1 + 2\delta r)z^{-2} = 0 \quad (11)$$

Equation (11) is a characteristic equation describing the response of the fundamental oscillator 66. This response has poles that can be moved inside or outside of the unit circle by adjusting the value $\delta r$. Moving the poles sets the amplitude of the output signal 34 from the numerically controlled digital dual frequency oscillator 28 to be set at a desired level.

The adjustment of $\delta r$ can be mechanized in accordance with the following description so as to control the amplitude of the oscillation of the oscillator portion of the numerically controlled digital dual frequency oscillator 28. The signal at the node 70 is squared in a fourth squaring element 90 and is provided to a first positive input of a seventh summer 92. The output of the second squaring element 62 is provided to a second positive input of the seventh summer 92. The output of the seventh summer 92 provides the square of the amplitude of the oscillator signal. The output of the seventh summer 92 is delayed by a fourth single-sample-period-delay element 94, whose initial-condition input is 0.

The output of the fourth single-sample-period-delay element 94 is provided to a negative input of an eighth summer 96 which has a positive input that receives the square of the desired amplitude of the oscillator signal on a reference input 98. The square of the desired amplitude of the oscillator signal is nominally 1.0. Accordingly, the eighth summer 96 subtracts the output from the fourth single-sample-period-delay element 94 from the signal on the reference input 98 to produce a clear measure of amplitude error. The output of the eighth summer 96 is scaled by ⅛ in a scaling element 100 in order to generate a stable amplitude control signal $\delta r$. The amplitude control signal $\delta r$ is applied to a second input of the second multiplier 48 to complete mechanization of the amplitude-control loop.

The output of the third multiplier 60 is scaled by two in a third doubler 102 in order to provide a double frequency sine signal on the output 30. That is, as discussed previously, the signals at the nodes 58 and 70 form a sine/cosine pair. The multiplier 60 multiplies this pair to form a $\sin(\theta)\cos(\theta)$ signal which is doubled by the third doubler 102 to produce a double frequency sine signal, $\sin(2\theta)$, thus utilizing the following trigonometric identity;

$$\sin(2\theta) = 2\sin(\theta)\cos(\theta) \quad (12)$$

In addition, the output of the second squaring element 62 is provided to a positive input of a ninth summer 106, and the output of the fourth squaring element 90 is provided to the negative input of the ninth summer 106. The output of the ninth summer 106 provides a double-frequency cosine output on the output 32. That is, the sine/cosine pair at the nodes 58 and 70 are squared by the corresponding second and fourth squaring elements 62 and 90 to form $\sin^2(\theta)$ and $\cos^2(\theta)$. These signals are subtracted by the ninth summer 106 to produce $\cos^2(\theta) - \sin^2(\theta)$ in order to produce a double frequency cosine signal, $\cos(2\theta)$, thus utilizing the following trigonometric identity:

$$\cos(2\theta) = \cos^2(\theta) - \sin^2(\theta) \quad (13)$$

Figure 3:
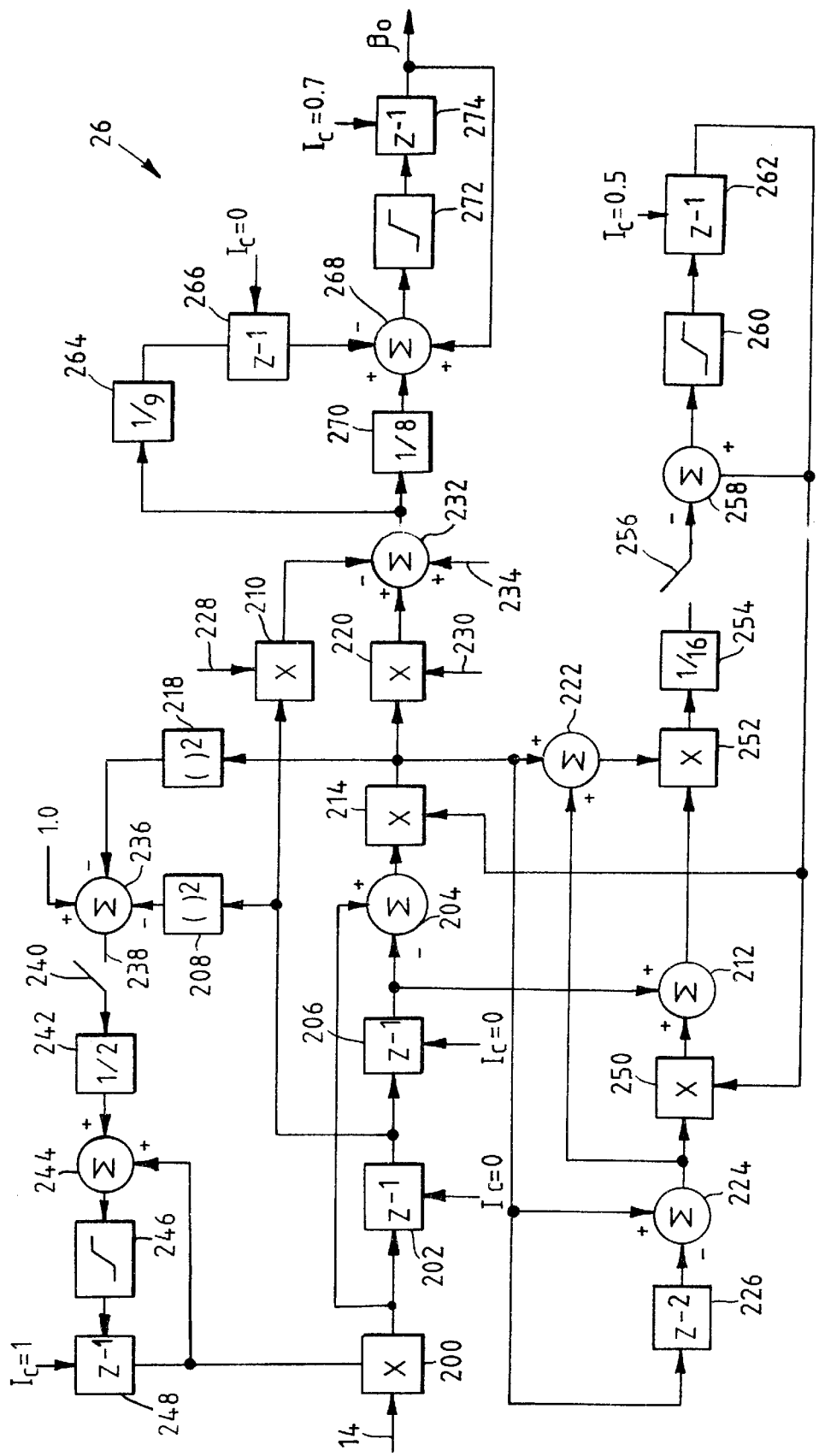
FIG. 3 shows in additional detail a driver for the numerically controlled digital dual frequency oscillator shown in FIG. 2; and, FIG. 4 shows an alternative embodiment for the numerically controlled digital dual frequency oscillator shown in FIG. 2.

The frequency controlling input signal $\beta_0$ is obtained from the driver 26 shown in more detail in FIG. 3. The driver 26 has three stages. The functions of the first stage of the driver 26 are (i) to provide automatic-gain control (AGC) for the sinusoidal input signal, whose input amplitude may vary, for example, from 10 to 0.001 (an 80-dB dynamic range), so that the amplitude of the sinusoid at the output of the first stage is 1.0, and (ii) to provide a precisely 90° phase shifted version of the sinusoidal input signal. The AGC controlled output of the first stage is presented as an input to the phase detecting second stage of the driver 26.

The function of the phase detecting second stage of the driver 26 is to mechanize phase detection of the error between the input signal and the doubled frequency output signal from the numerically controlled digital dual frequency oscillator 28, thereby permitting the fundamental frequency of oscillation of the numerically controlled digital dual frequency oscillator 28 to be one half of the frequency of the input to the driver 26.

The function of the third stage of the driver is to provide servo equalization for the phase locked loop 24.

As shown in FIG. 3, the output signal 14 from the gyro 10 is received at a first input of a first multiplier 200. As discussed above, the output signal 14 has a frequency of $2f_0$. The output of the first multiplier 200 (the AGC amplifier) is coupled to an input of a first single-sample-period-delay element 202 and to a positive input of a first summer 204. The output of the first single-sample-period-delay element 202 is coupled to the input of a second single-sample-period-delay element 206, to the input of a first squaring element 208, and to a first input of a second multiplier 210. The initial-condition inputs of both the first and second single-sample-period-delay elements 202 and 206 are 0.

The output of the second single-sample-period-delay element 206 is coupled to a negative input of the first summer 204 and to a first positive input of a second summer 212. The output of the first summer 204 is coupled to a first input of a third multiplier 214. The output of the third multiplier 214 is coupled to the input of a second squaring element 218, to a first input of a fourth multiplier 220, to a first positive input of a third summer 222, to a positive input of a fourth summer 224, and to the input of a two-sample-period-delay element 226 whose initial condition inputs are both 0 and whose output is coupled to a negative input of the fourth summer 224.

A second input 228 of the second multiplier 210 is coupled to the output 30 of the numerically controlled digital dual frequency oscillator 28 shown in FIG. 2. Similarly, a second input 230 of the fourth multiplier 220 is coupled to the output 32 of the numerically controlled digital dual frequency oscillator 28 shown in FIG. 2. The output of the second multiplier 210 is provided to a negative input a fifth summer 232. The output of the fourth multiplier 220 is provided to a positive input the fifth summer 232. An externally supplied phase offset 234 is provided to a positive input of the fifth summer 232. Accordingly, the fifth summer 232 generates the phase-locked loop phase-error signal. Thus, the second multiplier 210, the fourth multiplier 220, and the fifth summer 232 comprise the phase error detecting second stage of the driver 26.

The outputs of the first and second squaring elements 208 and 218 are provided to corresponding negative inputs of a sixth summer 236 which has a positive input that receives a constant which may have a value, for example, of 1.0. Accordingly, the sixth summer 236 subtracts the outputs of the first and second squaring elements 208 and 218 from 1.0 to generate a signal 238 which is a measure of the AGC gain error. A first switch 240, which connects the signal 238 to a first scaling element 242 having a gain of ½, is closed for sixteen consecutive samples, then opened for sixteen consecutive samples, subsequently closed for sixteen consecutive samples, and so on. The output of the first scaling element 242 is coupled to a first positive input of a seventh summer 244 whose output drives a first limiter 246. The limit values of the first limiter 246 are the reciprocals of the expected maximum and minimum amplitudes of the sinusoidal output signal 14. The output of the first limiter 246 is coupled to the input of a third single-sample-period-delay element 248 whose initial condition input is 1.0. The seventh summer 244, the first limiter 246, and the third single-sample-period-delay element 248 form an accumulator loop. The output of the third single-sample-period-delay element 248 is coupled to a second input of the first multiplier 200 and to a second positive input of the seventh summer 244. The first multiplier 200, the first and second squaring elements 208 and 218, the sixth summer 236, the first switch 240, the first scaling element 242, the seventh summer 244, the first limiter 246, and the third single-sample-period-delay element 248 comprise the automatic-gain control (AGC) function of the first stage of the driver 26.

The output of the fourth summer 224 is coupled to a second positive input of the third summer 222 and to a first input of a fifth multiplier 250 whose output is coupled to a second positive input of the second summer 212. The output of the second summer 212 is coupled to a first input of a sixth multiplier 252, and the output the third summer 222 is coupled to a second input of the sixth multiplier 252. The output of the sixth multiplier 252 is provided to a second scaling element 254 which scales the output of the sixth multiplier 252 by ¹⁄₁₆. The output of the second scaling element 254 is coupled by a second switch 256 to a negative input of an eighth summer 258. The second switch 256 is open when the first switch 240 is closed plus five clock periods after the first switch 240 opens. The second switch 256 is closed otherwise. The operation of the first and second switches 240 and 256 is timed to substantially eliminate interaction between the AGC function and the phase shifting function of the first stage of the driver 26.

The output of the eighth summer 258 is coupled to the input of a second limiter 260 whose lower limit value is ½ if the following inequality exists;

$$f_{max} \geq \frac{1}{4T} \tag{14}$$

Otherwise, the lower limit applied by the second limiter 260 has the following value:

$$\frac{1}{2\sin(4\pi f_{max}T)} \tag{15}$$

The upper limit applied by the second limiter 260 has the following value:

$$\frac{1}{2\sin(4\pi f_{min}T)} \tag{16}$$

The output of the second limiter 260 is coupled to the input of a fourth single-sample-period-delay element 262 whose initial condition input is 0.5 and whose output is coupled to a positive input of the eighth summer 258 and to the second inputs of the third and fifth multipliers 214 and 250. The first summer 204, the first single-sample-period-delay element 202, and the second single-sample-period-delay element 206 form a single-sample-time delay Hilbert transform whose gain is adaptively adjusted by the third multiplier 214 in response to the output of the fourth single-sample-period-delay element 262.

The first single-sample-period-delay element 202, the first summer 204, the second single-sample-period-delay element 206, and the third multiplier 214 comprise the unit-gain phase-shifting function of the first stage of the driver 26. The second summer 212, the third summer 222, the fourth summer 224, the two-sample-period-delay element 226, the fifth multiplier 250, the sixth multiplier 252, the second scaling element 254, the second switch 256, the eighth summer 258, the second limiter 260, and the fourth single sample-sample-period-delay element 262 comprise the gain-computing function for the phase shifter.

The phase error output of the fifth summer 232 is scaled by ⅕ in a third scaling element 264, and this scaled phase error is delayed by one sample period in a fifth single-sample-period-delay element 266. The initial-condition input of the fifth single-sample-period-delay element 266 is 0. The output of the fifth single-sample-period-delay element 266 is provided to a negative input of a ninth summer 268. The phase error output of the fifth summer 232 is also scaled by ⅛ in a fourth scaling element 270, and this scaled phase error is provided to a first positive input of the ninth summer 268. The frequency controlling signal $\beta_0$ is provided to a second positive input of the ninth summer 268. The output of the ninth summer 268 is coupled to the input of a third limiter 272. The upper and lower limits of the third limiter 272 are defined by the following equations:

$$\beta_{max} = \cos(2\pi f_{min} T) \quad (17)$$

and $$\beta_{min} = \cos(2\pi f_{max} T) \quad (18)$$

respectively. The output of the third limiter 272 is coupled to the input of a sixth single unit-sample-period-delay element 274. The initial condition input to the sixth single unit-sample-period-delay element 274 is the approximate average of $\beta_{max}$ and $\beta_{min}$.

The output from the sixth single unit-sample-period-delay element 274 provides the frequency controlling signal $\beta_0$. The output from the sixth single unit-sample-period-delay element 274 is also the output of the driver 26 and is provided to the input of the numerically controlled digital dual frequency oscillator 28 as shown in FIGS. 1 and 2. The third scaling element 264, the fifth single-sample-period-delay element 266, the ninth summer 268, the fourth scaling element 270, the third limiter 272, and the sixth single unit-sample-period-delay element 274 form a loop filter and comprise the third stage of the driver 26. This third stage of the driver 26 integrates the output of the phase detecting second stage and provides servo equalization for the phase locked loop 24. The loop filter is an integrator, the third scaling element 264, the fifth single-sample-period-delay element 266, and the fourth scaling element 270 form a lead filter of the loop filter, and the third limiter 272 is in a feedback loop of the loop filter.

Accordingly, the gyro 10 receives the motor drive signal 18 that is based on an output from the phase locked loop 24 which has a frequency $f_0$, for example, between 4 kHz and 6 kHz and that is sampled at a sampling rate, for example, of 39,600 samples/sec. The gyro 10 provides the output signal 14, which is an output sinusoid having a frequency $2f_0$ that is twice the frequency $f_0$ of the analog motor drive signal 18, and the gyro 10 also provides the output signal 16, which is a rate output signal that provides information on angular body rate about the input axis of the gyro 10 and that is DSSC modulated on a carrier having a frequency $2f_0$ which is twice the frequency $f_0$ of the analog motor drive signal 18. The amplitude of the output signal 14, especially during acquisition, can vary by as much as 80 dB, so that a powerful AGC function is required. The AGC function of the present invention meets this requirement. Moreover, the phase locked loop 24 phase locks onto the output signal 14 within a few milliseconds, provides a spectrally pure motor control signal 34 at half the frequency of the input signal, and provides spectrally pure sine and cosine signals for DSSC demodulation of the body-rate information.

Figure 4:
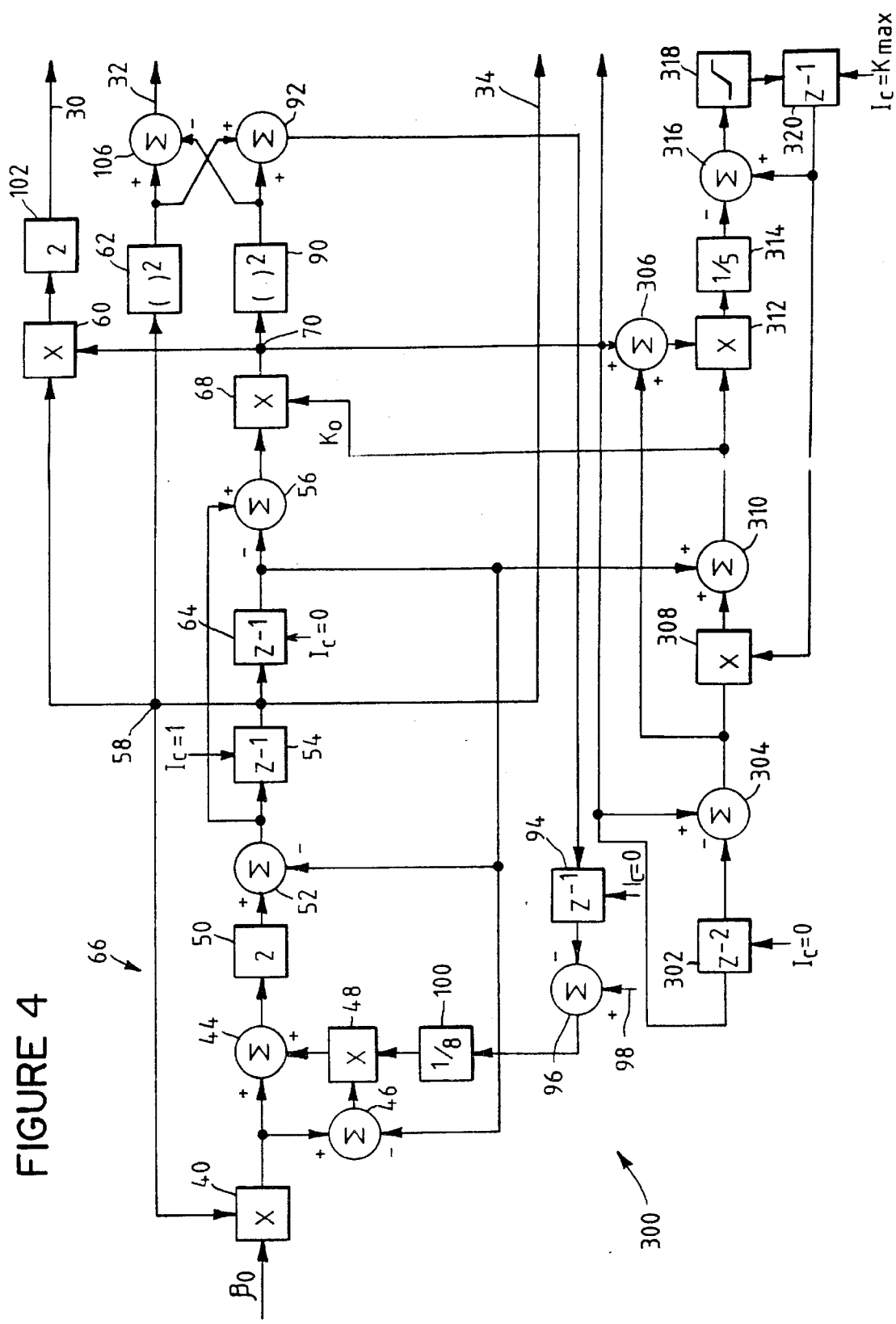

FIG. 4 shows a numerically controlled digital dual frequency oscillator 300 according to an alternative embodiment of the numerically controlled digital dual frequency oscillator 28 shown in FIG. 2. A comparison of the numerically controlled digital dual frequency oscillators 28 and 300 demonstrates that many of the elements are common and, therefore, the same reference numerals are used for these common elements, and the description of these common elements will not be repeated here. As can be seen, the elements of the numerically controlled digital dual frequency oscillator 28 involved in computing the gain $K_0$ have been replaced by new elements for computing the gain $K_0$ in the numerically controlled digital dual frequency oscillator 300 of FIG. 4. The elements for computing the gain $K_0$ in the numerically controlled digital dual frequency oscillator 300 are disclosed in co-pending U.S. patent application Ser. No. 09/253,205 filed on Feb. 9, 1999.

As shown in FIG. 4, the signal on the node 70 is provided to an input of a two-sample-period-delay element 302, to a positive input of a summer 304, and to a first positive input of a summer 306. The two-sample-period-delay element 302 has initial conditions of 0,0 and an output coupled to a negative input of the summer 304. The output of the summer 304 is coupled to a second positive input of the summer 306 and to a first input of a multiplier 308 which has an output coupled to a first positive input of a summer 310. The output of the second single-sample-period-delay element 64 is coupled to a second input of the summer 310. The output of the summer 310 is coupled to a first input of a multiplier 312, and the output of the summer 306 is coupled to a second input of the multiplier 312. The output of the multiplier 312 is scaled by ⅕ in a scaling element 314, and the output of the scaling element 314 is coupled to a negative input of a summer 316. The output of the summer 316 is limited by a limiter 318 to a value between $K_{max}$ and $K_{min}$ which are given by equations (6) and (7), respectively. The output of the limiter 318 is coupled to a single-sample-period-delay element 320 whose output is coupled to a second input of the multiplier 308, to the second input of the fourth multiplier 68, and to a positive input of the summer 316.

Certain modifications of the present invention have been discussed above. Other modifications will occur to those practicing in the art of the present invention. For example, the driver 26 and the numerically controlled digital dual frequency oscillators 28 and 300 may be implemented by hardware, software, firmware, digital signal processors, logic arrays, and other suitable mechanisms.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

I claim:

1. An apparatus implementing a digital phase locked loop comprising:

an automatic gain control arranged to apply gain to an input signal in order to produce a gain controlled signal;

a 90° phase shifter arranged to provide a 90° phase shifted version of the gain controlled signal;

a phase detector driven by the gain controlled signal, by the 90° phase shifted version of the gain controlled signal, and by sinusoidal and co-sinusoidal signals;

a loop filter arranged to integrate an output of the phase detector and to provide servo equalization for the phase-locked loop; and, a digital dual frequency oscillator having a fundamental frequency controlled by an output signal from the loop filter in order to generate the sinusoidal and co-sinusoidal signals.

2. The apparatus of claim 1 wherein the automatic gain control includes an error generator that generates an AGC error based upon the gain controlled signal, the 90° phase shifted version of the gain controlled signal, and a constant.

3. The apparatus of claim 2 wherein the error generator is arranged to generate the AGC error by subtracting squares of the gain controlled signal and the 90° phase shifted version of the gain controlled signal from the constant.

4. The apparatus of claim 3 wherein the constant is substantially 1.0.

5. The apparatus of claim 2 wherein the AGC error is scaled and drives an accumulator loop that contains a limiter.

6. The apparatus of claim 5 wherein the accumulator output drives a multiplier, and wherein the multiplier functions as an AGC amplifier operating on the input signal.

7. The apparatus of claim 2 wherein the 90° phase shifter comprises an adaptively gain-adjusted single-sample-time delay Hilbert transformer.

8. The apparatus of claim 7 wherein the AGC error is scaled and drives an accumulator loop that contains a limiter.

9. The apparatus of claim 8 further comprising switches arranged to substantially eliminate interaction between the accumulator loop and the adaptively gain-adjusted single-sample-time delay Hilbert transformer.

10. The apparatus of claim 1 wherein the loop filter comprises an integrator, wherein the integrator comprises a feedback loop and a lead filter, and wherein the feedback loop comprises a limiter.

11. The apparatus of claim 1 wherein the digital dual frequency oscillator is arranged to produce in-phase and quadrature components of the output signal from the loop filter, wherein the digital dual frequency oscillator is arranged to produce squares of the in-phase and quadrature components, wherein the digital dual frequency oscillator is arranged to sum the squares of the in-phase and quadrature components so as to produce a measure of an amplitude of an output of the digital dual frequency oscillator, wherein the digital dual frequency oscillator has a response having poles, and wherein the amplitude of the output of the digital dual frequency oscillator is set to a desired level by moving the poles inside or outside of the unit circle in response to the sum of the squares.

12. The apparatus of claim 1 wherein the digital dual frequency oscillator is arranged to produce primary outputs, and wherein the primary outputs comprise in-phase and quadrature components at the fundamental frequency.

13. The apparatus of claim 12 wherein the digital dual frequency oscillator is arranged to produce secondary outputs, and wherein the secondary outputs comprise in-phase and quadrature components having a frequency that is twice the fundamental frequency.

14. The apparatus of claim 13 wherein the digital dual frequency oscillator implements trigonometric sine and cosine double-angle formulas to produce the secondary outputs.

15. The apparatus of claim 14 wherein the input signal has a frequency, and wherein the secondary outputs are coupled to the phase detector so as to force the fundamental frequency of the digital dual frequency oscillator to be one-half of the frequency of the input signal.

16. The apparatus of claim 1 wherein the 90° phase shifter comprises two single-sample-period-delay elements.

17. The apparatus of claim 1 further comprising an amplitude controller arranged to control an amplitude of a signal generated by the digital dual frequency oscillator.

18. A method implemented by a phase locked loop comprising:

applying a gain to an input signal to produce an in-phase gain controlled signal, wherein the input signal has a frequency $2f_0$;

shifting the in-phase gain controlled signal by 90° to produce a quadrature gain controlled signal;

detecting a phase difference dependent upon the in-phase gain controlled signal, the quadrature gain controlled signal, and first and second output signals; and, producing the first and second output signals and a third output signal in response to the phase difference, wherein the third output signal has a frequency $f_0$, and wherein the each of the first and second output frequencies has a frequency $2f_0$.

19. The method of claim 18 wherein the producing of the first and second output signals and a third output signal comprises:

integrating and servo equalizing the phase difference; and, producing the first and second output signals and the third output signal in response to the integrated and servo equalized phase difference.

20. The method of claim 18 wherein the applying of a gain to an input signal comprises:

generating an AGC error based on the in-phase gain controlled signal, the quadrature gain controlled signal, and a constant; and, applying the gain to the input signal based on the AGC error.

21. The method of claim 20 wherein the generating of an AGC error comprises:

squaring the in-phase gain controlled signal and she quadrature gain controlled signal; and, generating the AGC error by subtracting the squares of the in-phase gain controlled signal and the quadrature gain controlled signal from the constant.

22. The method of claim 21 wherein the constant is substantially 1.0.

23. The method of claim 20 wherein the applying of the gain comprises;

scaling the AGC error;

driving an accumulator loop that contains a limiter in response to the scaled AGC error; and, applying the gain to the input signal based on an output of the accumulator loop.

24. The method of claim 23 wherein the applying of the gain to the input signal comprises multiplying the input signal by the output of the accumulator loop.

25. The method of claim 18 wherein the shifting of the in-phase gain controlled signal by 90° comprises applying an adaptively gain-adjusted single-sample-time delay Hilbert transform to the in-phase gain controlled signal.

26. The method of claim 25 wherein the applying of a gain to an input signal comprises:

generating an AGC error; and, applying the gain to the input signal based on the AGC error.

27. The method of claim 26 further comprising performing switching so as substantially eliminate interaction between the applying of the gain to the input signal based on the AGC error and the applying of the adaptively gain-adjusted single-sample-time delay Hilbert transform.

28. The method of claim 18 wherein one of the first and second output signals is based upon an in-phase component, wherein the other of the first and second output signals is based upon a quadrature component, wherein each of the in-phase and quadrature components has a frequency $f_0$, and wherein the producing of the first and second output signals comprises:

squaring the in-phase component;

squaring the quadrature component;

summing the squares of the in-phase and quadrature components so as produce a summed output, wherein the summed output has an amplitude; and, comparing the sum to a reference to produce an amplitude control signal; and, controlling the amplitude of at least one of the first, second, and third output signals in response to the amplitude control signal.

29. The method of claim 18 wherein the third output signal comprises in-phase and quadrature components.

30. The method of claim 18 wherein one of the first and second output signals is based upon an in-phase component, wherein the other of the first and second output signals is based upon a quadrature component, wherein each of the in-phase and quadrature components has a frequency $f_0$, and wherein the producing of the first and second output signals comprises:

multiplying the in-phase and quadrature components to produce a product and doubling the product so as to produce the first output signal in accordance with the following equation:

$$\sin(2\theta) = 2\sin(\theta)\cos(\theta)$$

wherein $\sin(2\theta)$ is the first output signal, wherein $\sin(\theta)$ is the in-phase component, and wherein $\cos(\theta)$ is the quadrature component;

squaring the in-phase component;

squaring the quadrature component; and, subtracting the squared quadrature component from the squared in-phase component so as to produce the second output signal in accordance with the following equation:

$$\cos(2\theta) = \cos^2(\theta) - \sin^2(\theta)$$

wherein $\cos(2\theta)$ is the second output signal, wherein $\sin^2(\theta)$ is the squared in-phase component, and wherein $\cos^2(\theta)$ is the squared quadrature component.

31. The method of claim 18 wherein the detecting of a phase difference comprises:

multiplying the in-phase gain controlled signal by the first output signal to produce a first product;

multiplying the quadrature gain controlled signal by the second output signal to produce a second product; and, forming a difference between the first and second products.

32. A method of driving a gyro comprising:

shifting an in-phase signal by 90° to produce a quadrature signal, wherein the in-phase signal is derived from a first output of the gyro, wherein the in-phase signal has a frequency $2f_0$, and wherein the quadrature signal has a frequency $2f_0$;

detecting a phase difference dependent upon the in-phase signal, the quadrature signal, and first and second output signals;

producing the first and second output signals and a third output signal in response to the phase difference, wherein the third output signal has a frequency $f_0$, and wherein the each of the first and second frequencies has a frequency $2f_0$;

producing an angular rate indicating signal based upon a second output of the gyro and the first and second output signals; and, driving the gyro in response to the third output signal.

33. The method of claim 32 wherein the shifting of an in-phase signal by 90° to produce a quadrature signal comprises:

applying a gain to an input signal to produce in-phase signal, wherein the input signal is derived from the first output of the gyro; and, shifting the in-phase signal by 90° to produce the quadrature signal.

34. The method of claim 33 wherein the applying of a gain to an input signal comprises:

generating an AGC error based on the in-phase signal, the quadrature signal, and a constant; and, applying the gain to the input signal based on the AGC error.

35. The method of claim 33 wherein the shifting of the in-phase signal by 90° comprises applying an adaptively gain-adjusted single-sample-time delay Hilbert transform to the in-phase signal.

36. The method of claim 35 wherein the applying of a gain to an input signal comprises:

generating an AGC error; and, applying the gain to the input signal based on the AGC error.

37. The method of claim 36 further comprising performing switching so as to substantially eliminate interaction between the applying of the gain to the input signal based on the AGC error and the applying of the adaptively gain-adjusted single-sample-time delay Hilbert transform.

38. The method of claim 32 wherein one of the first and second output signals is based upon an in-phase component, wherein the other of the first and second output signals is based upon a quadrature component, wherein each of the in-phase and quadrature components has a frequency $f_0$, and wherein the producing of the first and second output signals comprises:

multiplying the in-phase and quadrature components to produce a product and doubling the product so as to produce the first output signal in accordance with the following equation:

$$\sin(2\theta) = 2\sin(\theta)\cos(\theta)$$

wherein $\sin(2\theta)$ is the first output signal, wherein $\sin(\theta)$ is the in-phase component, and wherein $\cos(\theta)$ is the quadrature component;

squaring the in-phase component;

squaring the quadrature component; and, subtracting the squared quadrature component from the squared in-phase component so as to produce the second output signal in accordance with the following equation:

$$\cos(2\theta)=\cos^2(\theta)-\sin^2(\theta)$$

wherein $\cos(2\theta)$ is the second output signal, wherein $\sin^2(\theta)$ is the squared in-phase component, and wherein $\cos^2(\theta)$ is the squared quadrature component.

39. The method of claim 32 wherein the detecting of a phase difference comprises:

multiplying the in-phase signal by the first output signal to produce a first product;

multiplying the quadrature signal by the second output signal to produce a second product; and, forming a difference between the first and second products.

* * * * *

UNITED STATES PATENT AND TRADEMARK OFFICE
CERTIFICATE OF CORRECTION

PATENT NO. : 6,564,636 B2
DATED : May 20, 2003
INVENTOR(S) : Stanley A. White

It is certified that error appears in the above-identified patent and that said Letters Patent is hereby corrected as shown below:

<u>Title page,</u>
Item [54], Title, please insert -- A -- before "WIDE";

<u>Column 5,</u>
Line 11, please delete "is" after "72";

<u>Column 11,</u>
Line 10, change "sinuscidal" to -- sinusoidal --; and

<u>Column 12,</u>
Line 51, change "she" to -- the --.

Signed and Sealed this

Twentieth Day of April, 2004

JON W. DUDAS
*Acting Director of the United States Patent and Trademark Office*